United States Patent
Kim

(10) Patent No.: US 7,608,535 B2
(45) Date of Patent: Oct. 27, 2009

(54) METHOD FOR FORMING METAL CONTACT IN SEMICONDUCTOR DEVICE

(75) Inventor: Hyun Phill Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 346 days.

(21) Appl. No.: 11/618,695

(22) Filed: Dec. 29, 2006

(65) Prior Publication Data

US 2008/0003816 A1      Jan. 3, 2008

(30) Foreign Application Priority Data

Jun. 30, 2006    (KR) ...................... 10-2006-0061521

(51) Int. Cl.
*H01L 21/4763*    (2006.01)
(52) U.S. Cl. ........................ 438/629; 438/654; 438/656; 438/675; 438/677; 438/688; 257/E21.588
(58) Field of Classification Search .................. 438/677
See application file for complete search history.

(56) References Cited

U.S. PATENT DOCUMENTS 6,296,747 B1 * 10/2001 Tanaka .................. 204/298.07
6,673,718 B1 * 1/2004 Lee et al. ..................... 438/677
7,041,597 B2   5/2006 Lim
7,074,690 B1   7/2006 Gauri et al.
2005/0179141 A1 * 8/2005 Yun et al. .................... 257/774

FOREIGN PATENT DOCUMENTS

KR    1019930006720 B1    7/1993
KR    1019980080279       11/1998
KR    1020040043219 A     5/2004
KR    10-2005-0009352 A   1/2005

* cited by examiner

*Primary Examiner*—Stephen W Smoot
(74) *Attorney, Agent, or Firm*—Townsend and Townsend and Crew LLP

(57) ABSTRACT

An interlayer insulation layer is formed on a semiconductor substrate to cover a lower wiring layer that is also formed on the semiconductor substrate. A contact hole to expose a surface of the lower wiring layer is formed by etching the interlayer insulation film. A wetting layer is formed on an inner wall of the contact hole. An anti-deposition layer is formed around an entrance of the contact hole to prevent an aluminum layer from being deposited around the entrance of the contact hole. The contact hole is filled with the aluminum layer.

8 Claims, 2 Drawing Sheets

METHOD FOR FORMING METAL CONTACT IN SEMICONDUCTOR DEVICE

CROSS-REFERENCE TO RELATED APPLICATION

The present application claims priority to Korean application number 10-2006-0061521, filed on Jun. 30, 2006, which is incorporated by reference in its entirety.

BACKGROUND OF THE INVENTION

The present invention relates to a method for manufacturing a semiconductor device, and more particularly, a method for forming metal contacts in a semiconductor device.

With the increasing integration of semiconductor devices, a lamination structure is widely prevalent in metal wirings. In the lamination structure of wirings, an upper conductive layer has electric contact with a lower conductive layer through contact holes, and aluminum (Al) and tungsten (W) are commonly used for the contact between the upper and lower conductive layers.

Recently, to guarantee a low contact resistance and low manufacturing costs, an aluminum plug process is widely employed. The aluminum plug process reflows the deposited aluminum layer by heating the aluminum layer in a high-temperature reflow chamber for a long time. However, the aluminum plug process has the problem of causing a leakage current in a following process because it is performed at a high temperature. To solve this problem, research into a warm aluminum method that is performed at an aluminum flow temperature without the reflow chamber is in progress. However, in the application of the warm aluminum method, if the height of the contact hole is large compared to the width of the contact hole, a part of the contact hole may exhibit an overhang phenomenon preventing aluminum from entering the contact holes, thereby resulting in a poor fill.

SUMMARY OF THE INVENTION

Embodiments of the invention are directed to a method for forming metal contacts in a semiconductor device.

In one embodiment, a method for forming a metal contact in a semiconductor device comprising: forming an interlayer insulation layer on a semiconductor substrate to cover a lower wiring layer; forming a contact hole to expose a surface of the lower wiring layer by etching the interlayer insulation film; forming a wetting layer on an inner wall of the contact hole; forming an anti-deposition layer around an entrance of the contact hole to prevent an aluminum layer from being deposited around the entrance of the contact hole; and filling the contact hole with the aluminum layer.

The filling of the contact hole using the aluminum layer comprises: depositing the aluminum layer on the semiconductor substrate formed with the anti-deposition layer; and reflowing the aluminum layer to completely fill the contact hole.

After the filling of the contact hole using the aluminum layer, an upper wiring layer to be connected to the lower wiring layer is formed by depositing an aluminum layer on an overall surface of the resultant semiconductor substrate.

DESCRIPTION OF THE SPECIFIC EMBODIMENTS

The present invention relates to a method for forming a metal contact in a semiconductor device. An interlayer insulation layer is formed on a semiconductor substrate to cover a lower wiring layer. A contact hole to expose a surface of the lower wiring layer is formed by etching the interlayer insulation film. A wetting layer is formed on an inner wall of the contact hole. An anti-deposition layer is formed around an entrance of the contact hole to prevent an aluminum layer from being deposited around the entrance of the contact hole. And, the contact hole is filled with the aluminum layer.

The even filling of the contact hole can be achieved without generation of voids. As a result, a metal contact having a low contact resistance and high reliability can be formed. Also, as compared to a conventional tungsten plug method, the formation process of the metal contact can be simplified, resulting in a reduction in manufacturing costs.

Figure 1:
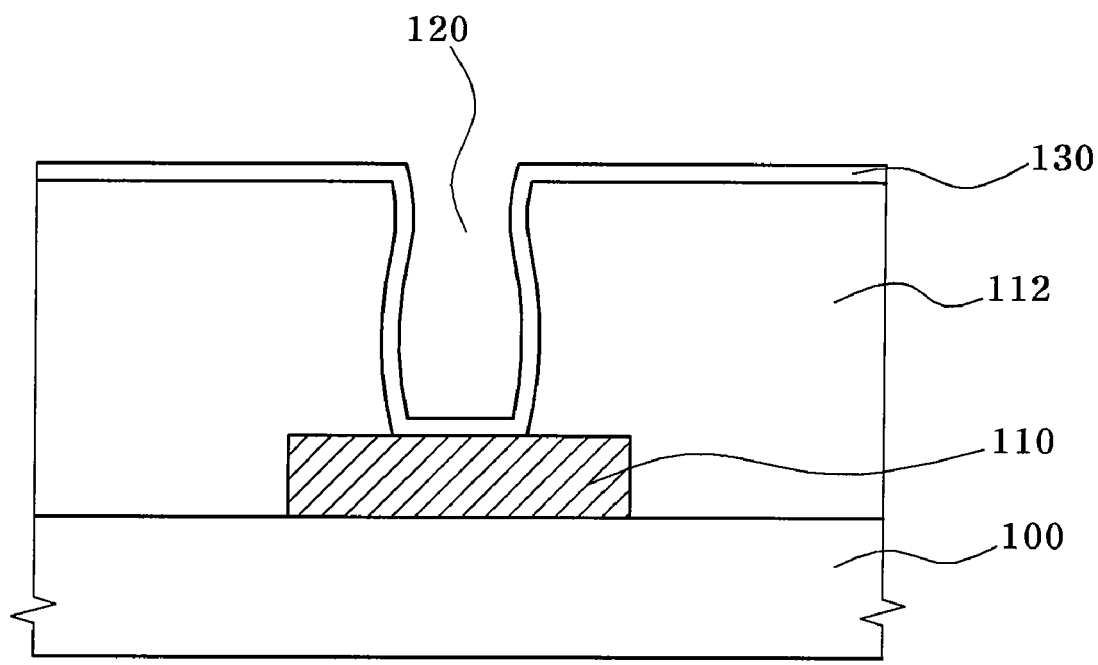
FIG. 1 is a sectional view illustrating a contact hole for forming a metal contact and a wetting layer formed on a semiconductor substrate.

FIG. 1 illustrates a step for forming a contact hole 120 used to form a metal contact and a wetting layer 130.

The wetting layer 130 is formed by depositing a wetting material on a semiconductor substrate 100 in which the contact hole 120 is formed to expose a part of a lower wiring layer 110. Specifically, first, the lower wiring layer 110 (e.g., aluminum layer) is formed on the semiconductor substrate 100, and in turn, an interlayer insulation layer 112 is formed to cover the lower wiring layer 110. Then, the contact hole 120 is formed by etching the interlayer insulation layer 112, so as to expose a part of the lower wiring layer 110 to the outside. Although not shown, the semiconductor substrate 100, on which the lower wiring layer 110 is formed, is also formed with a device isolating layer defining an active region, gate stacks including a gate insulation layer, an impurity diffusion region, etc. The interlayer insulation layer 112 may be formed of an insulation film, such as an oxide layer or nitride layer.

Next, the wetting layer 130 is formed on the resulting semiconductor substrate having the contact hole 120 by depositing a wetting material, for example, titanium (Ti) in a self ionized plasma (SIP) process. The wetting layer 130 serves to facilitate the deposition of an aluminum layer. Having superior step coverage characteristics, the wetting layer 130 is able to be evenly deposited on the sidewall surface of the contact hole 120 as well as the bottom surface of the contact hole 120.

Figure 2:
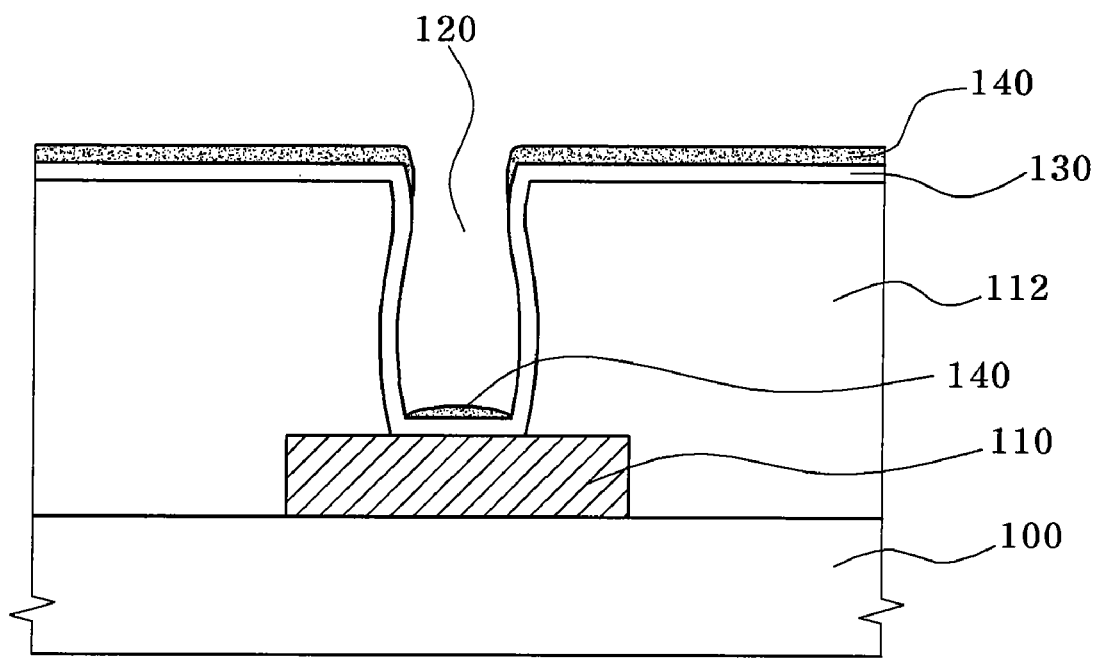
FIG. 2 is a sectional view illustrating a tungsten layer formed on the wetting layer.

FIG. 2 illustrates a tungsten layer 140 formed on the resulting semiconductor substrate having the wetting layer 130.

The tungsten layer 140 is deposited on the wetting layer 130 with a relatively thin thickness of approximately 50 Å in a physical vapor deposition (PVD) process, which has very poor step coverage characteristics. Therefore, when using the PVD process for the deposition of the tungsten layer 140, the tungsten layer 140 is deposited only on the bottom surface of the contact hole 120, and around the entrance of the contact hole 120.

Figure 3:
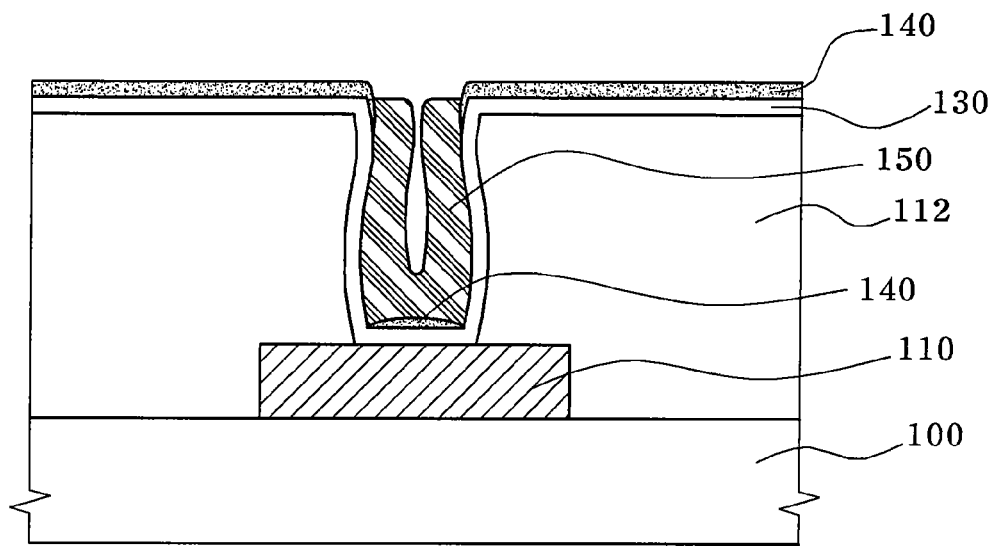
FIG. 3 is a sectional view illustrating an aluminum layer formed in the contact hole.

FIG. 3 illustrates an aluminum layer 150 formed in the contact hole 120.

The aluminum layer 150 is deposited on the tungsten layer 140 formed on the semiconductor substrate by a chemical vapor deposition (CVD) process. Since deposition characteristics of the CVD aluminum layer depend on the under-layer, the aluminum layer 150 is not deposited where the tungsten layer 140 has been deposited previously. Accordingly, the aluminum layer 150 is deposited selectively on a region where the titanium wetting layer 130 is exposed, i.e. deposited in the contact hole.

Figure 4:
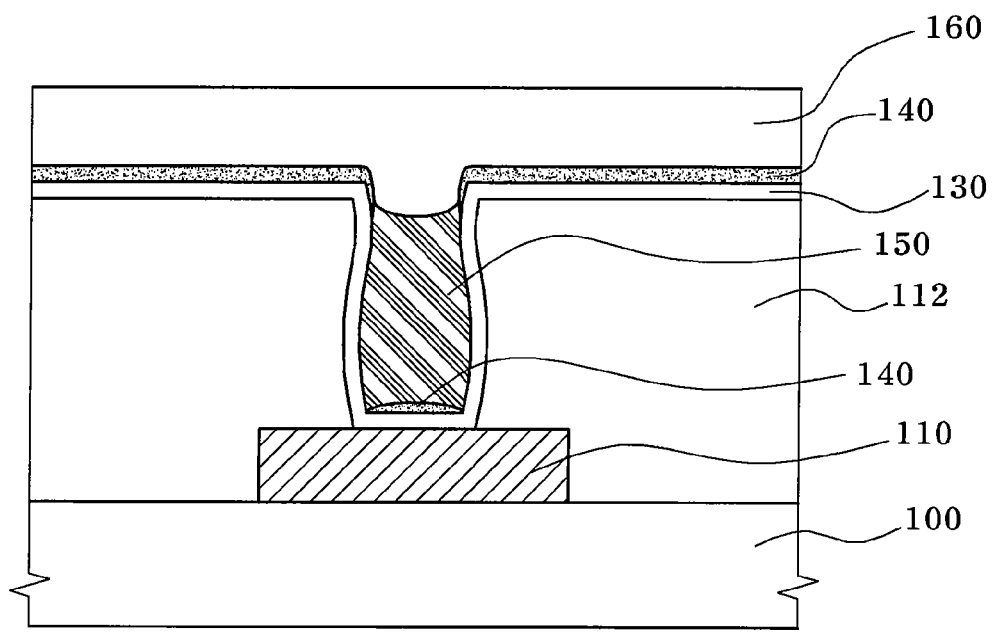
FIG. 4 is a sectional view illustrating an upper wiring layer formed on the contact hole in which the aluminum layer is completely filled by a reflow process.

FIG. 4 illustrates an upper wiring layer 160 formed on the contact hole in which the aluminum layer 150 is filled by a reflow process.

If the resulting semiconductor substrate is heat treated at a temperature of 400° C.~450° C., the aluminum layer 150, which was deposited on the semiconductor substrate, is reflowed to fill the contact hole as shown. The heat treatment for reflowing the aluminum layer 150 can be performed in a deposition chamber for the upper wiring layer 160 that will be formed in a following step.

The upper wiring layer 160 is formed by depositing an aluminum layer on the surface of the semiconductor substrate by a PVD process, etc., and patterning the deposited aluminum layer. Thereby, a metal contact electrically connected to the lower wiring layer 140 is completed. In the present invention, the aluminum deposition process for forming the upper wiring layer 160 is performed in the same equipment as that of the above described aluminum reflow process, and therefore, the overall method can be simplified.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal contact in a semiconductor device, the method comprising:

forming an interlayer insulation layer over a lower wiring layer that is formed over the semiconductor substrate;
   etching the interlayer insulation layer to form a contact hole, wherein the contact hole exposes a surface of the lower wiring layer;
   forming a wetting layer on an inner wall of the contact hole;
   forming an anti-deposition layer comprising tungsten (W) around an entrance of the contact hole to prevent an aluminum layer from being deposited around the entrance of the contact hole; and
   filling the contact hole with the aluminum layer.

2. The method according to claim 1, wherein the wetting layer formed on the inner wall of the contact hole includes titanium (Ti).

3. The method according to claim 2, wherein the wetting layer is formed using a self ionized plasma (SIP) process.

4. The method according to claim 1, wherein the anti-deposition layer is formed by a physical vapor deposition (PVD) process.

5. The method according to claim 1, wherein the filling of the contact hole using the aluminum layer comprises:

depositing the aluminum layer over the semiconductor substrate formed with the anti-deposition layer; and
   reflowing the aluminum layer to fill the contact hole.

6. The method according to claim 5, wherein the aluminum layer is formed by a chemical vapor deposition (CVD) process.

7. The method according to claim 5, further comprising:

after the filling of the contact hole using the aluminum layer, forming an upper wiring layer to be connected to the lower wiring layer by depositing an aluminum layer over a surface of the resultant semiconductor substrate.

8. The method according to claim 7, wherein the aluminum layer used to form the upper wiring layer is deposited in-situ within an aluminum layer reflow apparatus.

* * * * *